US010530131B2

(12) United States Patent
Hu et al.

(10) Patent No.: US 10,530,131 B2
(45) Date of Patent: Jan. 7, 2020

(54) LIGHT SOURCE SYSTEM AND LASER LIGHT SOURCE

(71) Applicant: Appotronics Corporation Limited, Shenzhen (CN)

(72) Inventors: Fei Hu, Shenzhen (CN); Jiayi Yang, Shenzhen (CN)

(73) Assignee: Appotronics Corporation Limited, Shenzhen (CN)

( * ) Notice: Subject to any disclaimer, the term of this patent is extended or adjusted under 35 U.S.C. 154(b) by 109 days.

(21) Appl. No.: 15/785,318

(22) Filed: Oct. 16, 2017

(65) Prior Publication Data
US 2018/0294623 A1 Oct. 11, 2018

Related U.S. Application Data

(63) Continuation of application No. 14/351,397, filed as application No. PCT/CN2012/079978 on Aug. 10, 2012, now Pat. No. 9,819,154.

(30) Foreign Application Priority Data

Oct. 11, 2011 (CN) .......................... 2011 1 0306719

(51) Int. Cl.
*H01S 5/40* (2006.01)
*F21Y 115/30* (2016.01)
(Continued)

(52) U.S. Cl.
CPC .......... *H01S 5/4075* (2013.01); *H01S 5/4012* (2013.01); *F21Y 2113/00* (2013.01);
(Continued)

(58) Field of Classification Search
CPC .............. F21Y 2113/00; F21Y 2115/10; F21Y 2115/30; H01S 5/4012; H01S 5/4075; H01S 5/4087
See application file for complete search history.

(56) References Cited

U.S. PATENT DOCUMENTS 4,978,197 A 12/1990 Horikawa
5,475,415 A * 12/1995 Noethen .................... B41J 2/45
347/238

(Continued)

FOREIGN PATENT DOCUMENTS

CN 1523388 A 8/2004
CN 1933266 A 3/2007
(Continued)

OTHER PUBLICATIONS

Chinese Office Action, dated Jul. 22, 2014, and Search Report dated Jul. 9, 2014, in a counterpart Chinese patent application, No. CN 201110306719.4.

(Continued)

*Primary Examiner* — Tsion Tumebo
(74) *Attorney, Agent, or Firm* — Chen Yoshimura LLP

(57) ABSTRACT

Disclosed are a light source system and a laser light source (300). The laser light source includes two groups of laser groups (20a, 20b), wherein at least one group of laser groups includes at least two lasers (21a, 21b, 21c, 21d), and the light beams (L1) generated by the two groups of laser groups are in the same direction and parallel to each other. The first projections of the two groups of laser groups on the cross section of the light beams formed by the respective emergent light rays thereof are partially overlapped with the second projections in a first direction, which first direction is the connection direction of at least two laser centres of a group of laser groups. The laser light source has the effects of being able to effectively increase the light power density and at the same time reduce the volume of the light source.

14 Claims, 14 Drawing Sheets

(51) Int. Cl.
  *F21Y 115/10* (2016.01)
  *F21Y 113/00* (2016.01)
(52) U.S. Cl.
  CPC ........ *F21Y 2115/10* (2016.08); *F21Y 2115/30* (2016.08); *H01S 5/4087* (2013.01)

(56) References Cited

U.S. PATENT DOCUMENTS

| | | | |
|---|---|---|---|
| 6,124,973 A * | 9/2000 | Du | G02B 27/09 359/618 |
| 6,240,116 B1 | 5/2001 | Lang | |
| 6,356,577 B1 | 3/2002 | Miller | |
| 7,006,549 B2 * | 2/2006 | Anikitchev | G02B 27/09 372/107 |
| 7,871,165 B2 | 1/2011 | Silverstein et al. | |
| 7,959,297 B2 | 6/2011 | Silverstein | |
| 8,132,919 B2 | 3/2012 | Harland | |
| 8,167,440 B2 | 5/2012 | Sato et al. | |
| 2004/0252744 A1 | 12/2004 | Anikitchev | |
| 2008/0095468 A1 | 4/2008 | Klemmer | |
| 2009/0122272 A1 | 5/2009 | Silverstein et al. | |
| 2009/0141242 A1 | 6/2009 | Silverstein et al. | |
| 2009/0284713 A1 * | 11/2009 | Silverstein | G02B 27/1033 353/8 |
| 2010/0302514 A1 | 12/2010 | Silverstein et al. | |
| 2010/0328633 A1 | 12/2010 | Sato et al. | |
| 2011/0292505 A1 | 12/2011 | Kurtz | |
| 2012/0002395 A1 | 1/2012 | Du | |
| 2012/0133903 A1 | 5/2012 | Tanaka | |
| 2012/0243105 A1 | 9/2012 | Sasamuro | |
| 2013/0162956 A1 | 6/2013 | Okuda | |

FOREIGN PATENT DOCUMENTS

| | | |
|---|---|---|
| CN | 101000444 U | 7/2007 |
| CN | 101144909 A | 3/2008 |
| CN | 201507843 U | 6/2010 |
| CN | 101878655 A | 11/2010 |
| CN | 101937163 A | 1/2011 |
| EP | 2043211 A2 | 4/2009 |
| JP | H2-61611 A | 3/1990 |
| JP | 2011-13317 A | 1/2011 |
| JP | 2011-505593 A | 2/2011 |

OTHER PUBLICATIONS

Chinese Office Action, dated Feb. 10, 2015, in a counterpart Chinese patent application, No. CN 201110306719.4.
Chinese Office Action, dated Nov. 29, 2016, in a counterpart Chinese patent application, No. CN 201510247161.5.
Chinese Office Action, dated Nov. 29, 2016, in a counterpart Chinese patent application, No. CN 201510249986.0.
Supplementary European Search Report in a counterpart application EP 12840038.9, dated Mar. 13, 2015.
Japanese Office Action, dated May 24, 2016 in a counterpart Japanese patent application, No. JP 2014-534925.
International Search Report in the parent PCT application No. PCT/CN2012/079978 dated Nov. 15, 2012.
IPRP in the parent PCT application No. PCT/CN2012/079978, dated Apr. 15, 2014.

* cited by examiner

LIGHT SOURCE SYSTEM AND LASER LIGHT SOURCE

BACKGROUND OF THE INVENTION

Field of the Invention

This invention relates to optical technologies, and in particular, it relates to light source systems and laser light sources.

Description of the Related Art

In conventional technologies, the light power of a typical single semiconductor laser device is about a few hundred mW, or up to 1-2 W for higher powered ones. It is currently difficult to achieve output power of a few watts or over 10 W for single semiconductor laser devices.

In some applications that require high power semiconductor lasers, such as projector, stage lighting system, etc., where the required light output is a few tens of watts, arrays of semiconductor lasers may be employed. Conventional semiconductor laser arrays simply arrange semiconductor lasers such as laser diodes in two-dimensional arrays, and use collimating lenses to collimate the light from the laser diodes.

FIG. 1a shows a 4×4 laser diode array. Typical light distribution of a laser diode 11 is an elliptical Gaussian distribution, with a relatively large divergence angle. The collimating lens (not shown) is typically a lens with rotational symmetry, which can collimate the light from the laser diode 11.

Also as shown in FIG. 1a, conventional laser diode arrangements are typically a planar arrangement with output light in the normal direction, where each laser diode 11 is mounted on a base 12. The projected area of the base 12 is larger than the area of the corresponding laser diode 11. The inventors of the present invention discovered through research that such a normal planar arrangement has certain disadvantages as follows:

Referring to FIG. 1b, because the output light distribution of the laser diode 11 is an elliptical Gaussian distribution, an elliptical light spot 13 is formed by the collimating lens (not shown in the drawing), and the area of the elliptical light spot 13 is much smaller than the corresponding projected area 14 of the base 12. Because the projected area 14 of the base 12 is larger than the corresponding projected area of the laser diode 11, the density of arrangement of the laser diode 11 cannot be too small; moreover, because the area of the elliptical light spot 13 is much smaller than the corresponding projected area 14 of the base 12, large gaps are formed between the light spots 13 in the array, so that the light spots 13 cannot be densely packed. Therefore, the light power density is impacted by the size of the base 12 and cannot be further increased. As a result, the advantages of high power density of laser cannot be fully realized. Although the light beams can be focused by focusing lenses into one light spot, the focused light beams are no longer parallel but have relatively large divergent angles, which is disadvantageous to the design of downstream optical systems.

To increase light power density, Chinese patent CN101937163 provides a light source unit that can achieve a tight packing of laser light spots. As shown in FIG. 2, the light source unit 200 includes a light source group 210 and a reflector group 220. The light source group 210 includes 6 light sources 201, and each light source 201 is formed by a light emitting device 205 and a collimating lens 207. The reflector group 220 includes 6 parallel reflectors 225 corresponding to the light sources 201, to reflect the light beams from the light sources 201 into light beams having smaller spacing between each other.

As shown in FIG. 2, if the diameter of the collimating lens 207 of the light source 201 is a, and the row space between two light sources is b, then the total column length of the light source group 210 with 6 light sources is 6a+5b. Because the light beams from the collimating lenses 207 of the light sources 201 are parallel lights, the light beam from the light source group 210 has a cross-sectional size of 6a+5b in the column direction of the array. If one reflector 220e is used to directly reflect the light beams from the light source group 210 relative to the column direction, the reflected light beam from the reflector 220e will have a cross-sectional size of 6a+5b in its column direction. But, if a rectangular reflector 225 is provided for each row of light sources, and the reflectors are arranged in a way that the spacing between adjacent rectangular reflectors 225 is reduced in the direction of the optical axis of the light source group 210, then the reflected beam from the rectangular reflectors 225 will eliminate the spacing b between the light sources 201 in the light source group 210. Thus, the length of the reflected beam in its column direction becomes 6a, resulting in more tightly packed laser light spots.

By studying the conventional technology, the inventors of this invention discovered that, each group of parallel reflectors can only compress light spot spacing in one direction, and the light spot spacing in the other, perpendicular direction is still large. To obtain a light spot array with compressed spacing in both directions, two groups of reflectors are required, increasing the volume of the light source unit and making it inconvenient in actual products.

SUMMARY OF THE INVENTION

Embodiments of the present invention provide a light source system and laser light source which can realize tight packing of the laser light spots, effectively increasing light power density and reducing product size.

Embodiments of the present invention provide a light source system, including at least one group of light sources, the one group of light sources including:

two laser groups, at least one laser group including at least two lasers, wherein the light beams generated by each laser group are in the same direction and parallel to each other;

two reflector groups corresponding to the two laser groups, at least one reflector group including at least two reflectors, each reflector being disposed on the optical axis of a corresponding laser, each reflector group reflecting the light beams generated by the corresponding laser group, wherein the spacing between light beams output from the reflector group is smaller than the spacing between light beams inputted to the reflector group;

wherein the light beams from the two laser groups are parallel to each other, and the light beams from the two reflector groups are in the same direction and parallel to each other;

wherein the first projections of the light beams of the two laser groups on their respective cross-sections partially overlap with each other when they are projected in a first direction as second projections, the first direction being along a line connecting the centers of the at least two lasers in one of the laser groups.

Embodiments of the present invention further provides a laser light source, including two laser groups, at least one laser group including at least two lasers, wherein the light beams from the two laser groups are in the same direction and parallel to each other; wherein the first projections of the light beams of the two laser groups on their respective cross-sections partially overlap with each other when they are projected in a first direction as second projections, the first direction being along a line connecting the centers of the at least two laser in one of the laser groups.

Embodiments of the present invention further provides a laser light source, including two laser groups, at least one laser group including at least two lasers, wherein the light beams from each of the two laser groups are in the same direction and parallel to each other, and the light beams from the two laser groups are in opposite directions and parallel to each other; two reflector groups for respectively reflecting the light beams generated by the two laser groups, wherein the reflected light of the two laser groups after being reflected by the reflectors are in the same direction and parallel to each other; wherein the first projections of the light beams of the two laser groups on their respective cross-sections partially overlap with each other when they are projected in a first direction as second projections, the first direction being along a line connecting the centers of the at least two laser in one of the laser groups.

Compared to the conventional technologies, embodiments of the present invention have the following advantages:

For convenience of description, the partial overlap of the first projections of the two laser groups when they are projected in a first direction as second projections is referred to as the offset arrangement of the laser groups. Using the offset arrangement of the laser diode groups, the spacing of light beams between groups of laser diodes can be compressed. Compared to conventional technologies, it significantly reduces the volume of the optical system and increases the light power density of the light source system.

BRIEF DESCRIPTION OF THE DRAWINGS

FIG. 1b is a diagram illustrating the light spot arrangement generated by the laser array of FIG. 1a;

DETAILED DESCRIPTION OF THE PREFERRED EMBODIMENTS

Figure 1A:
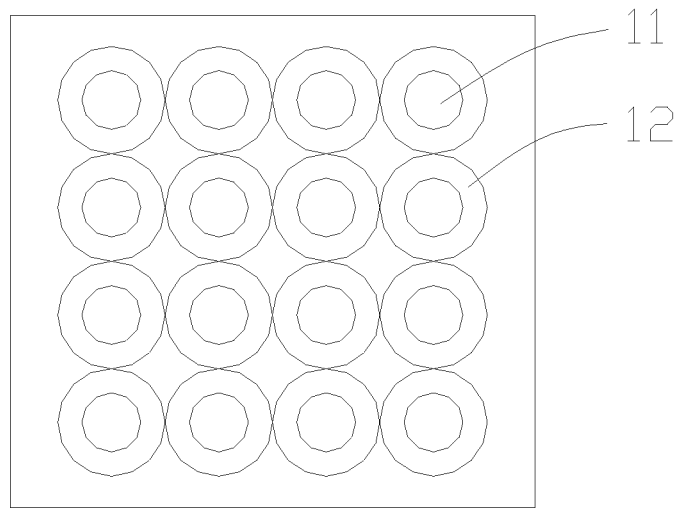
FIG. 1a is a diagram illustrating an arrangement of semiconductor lasers in a conventional semiconductor laser array.
Figure 1B:
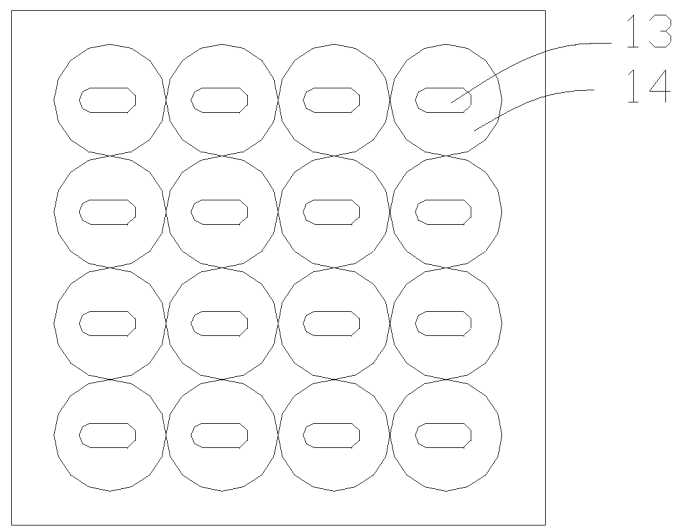
Figure 2:
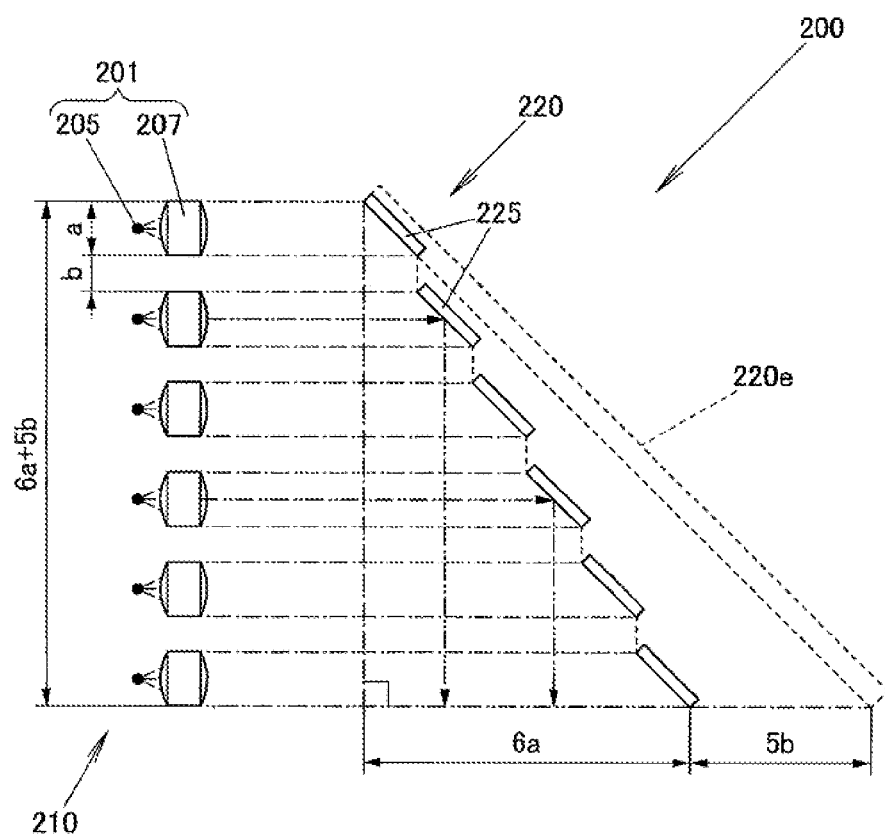
FIG. 2 is a diagram illustrating the structure of the light source unit in Chinese patent CN 101937163.
Figure 3:
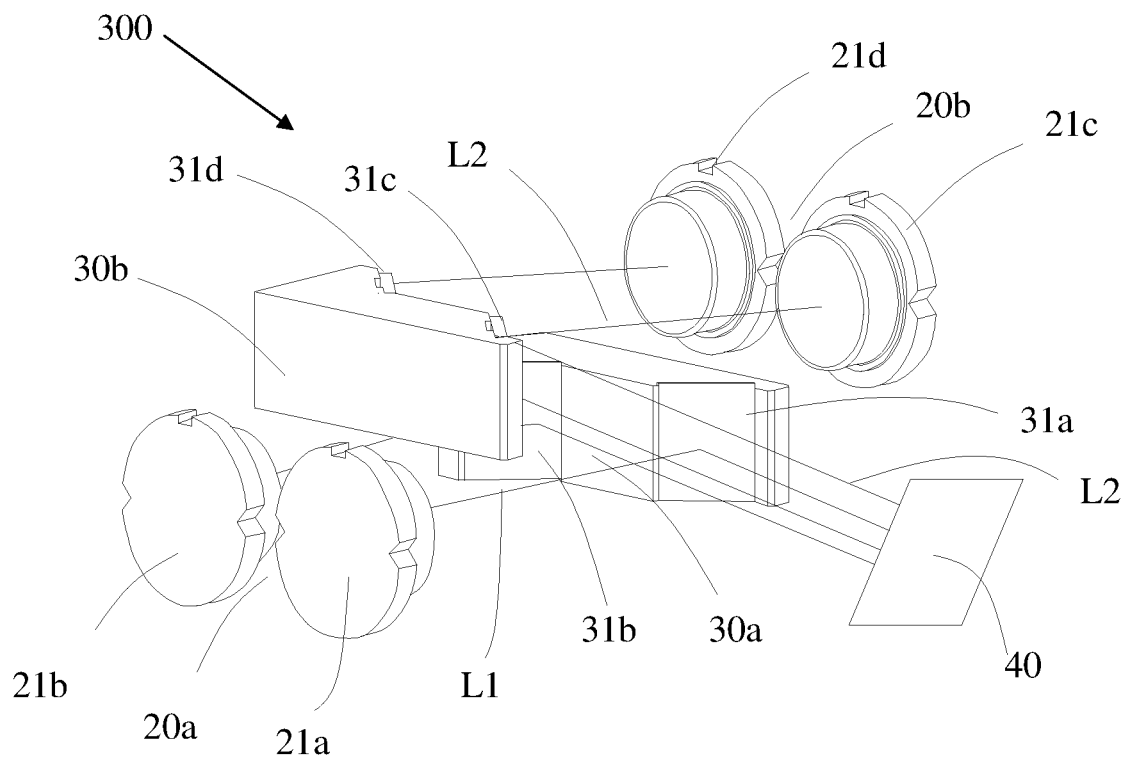
FIG. 3 is a diagram illustrating the structure of a light source system according to an embodiment of the present invention.

Referring to FIG. 3, which illustrates the structure of a light source system according to an embodiment of the present invention, the light source system includes a set of laser source 300, where each laser source 300 includes:

two laser groups 20a and 20b, where the laser group 20a includes two lasers 21a and 21b, and the laser group 20b includes two lasers 21c and 21d. The two laser groups are arranged in parallel, and the two light beams from the two lasers of the same laser group are in the same direction and parallel to each other;

two reflector groups 30a and 30b respectively corresponding to the two laser groups 20a and 20b, where the reflector group 30a includes two reflectors 31a and 31b respectively corresponding to the two lasers 21a and 21b, and the reflector group 30b includes two reflectors 31c and 31d respectively corresponding to the two lasers 21c and 21d; each reflector is disposed on the optical axis of its corresponding laser;

each reflector group reflects the light beams generated by the corresponding laser group; specifically, the reflector group 30a reflects the two light beams L1 generated by the laser group 20a, and the reflector group 30b reflects the two light beams L2 generated by the laser group 20b, such that the spacing between output beams from the reflector group is smaller than the spacing between input beams to the reflector group.

Figure 4:
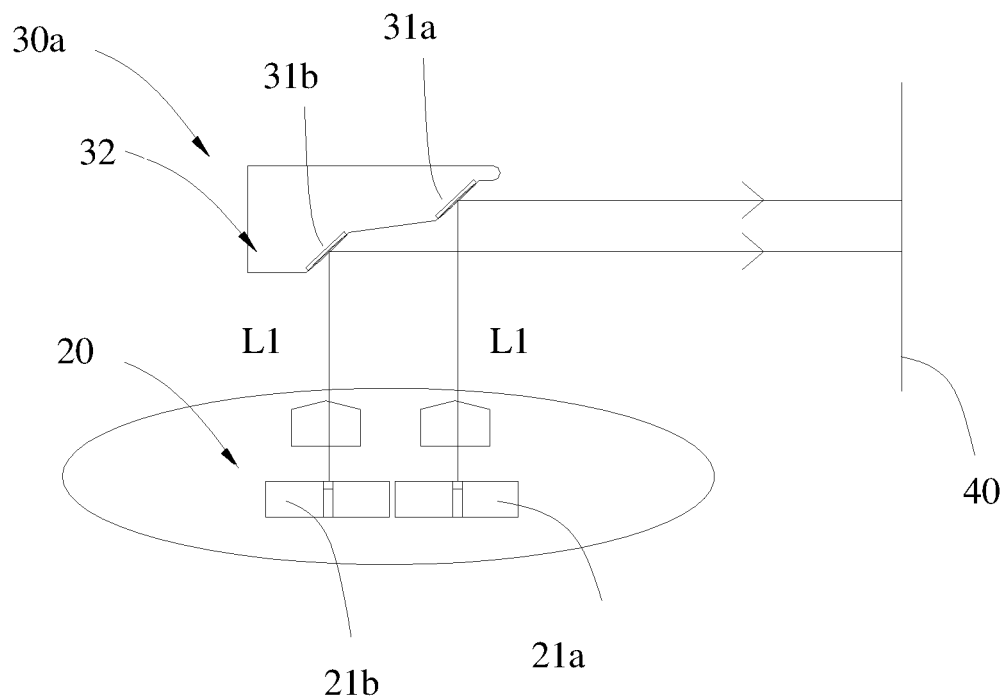
FIG. 4 is a top view of one laser group and one reflector group in the light source system of FIG. 3.

Refer to FIG. 4, which is a top view of one laser group and one reflector group in the light source system of FIG. 3. As shown in FIG. 4, the reflector group 30a includes a body 32 and two reflectors 31a and 31b disposed on the same side of the body 32. Of course, the number of reflectors provided on the same side of the body 32 may be other numbers, and it is not limited in this invention. The adjacent reflectors 31a and 31b form a step arrangement, i.e., the adjacent reflectors are disposed on different planes and are offset from each other. The distance between adjacent steps of the step arrangement, i.e. the height difference between the bottom of reflector 31a and the top of reflector 31b is smaller than the spacing between the light spots of the two light beams L1 that are incident on the adjacent reflectors 31a and 31b, so that the spacing between the light spots is reduced from the spacing between the light spots of the two light beams L1 incident on the reflector group 30a to the spacing between the light spots of the two light beams L1 output from the reflector group. The principle of spacing reduction is similar to that explained in CN101937163 and will not be described in detail here.

Preferably, the projections of the two reflectors 31a and 31b in the direction of their respective output light are in contact with each other, i.e., the line connecting the bottom of the reflector 31a and the top of the reflector 31b is parallel to the output light direction of the reflectors, so as to reduce the size of the reflector group 30a.

Further, the reflector group reduces the spacing between the light spots, so that adjacent light beams from the same laser group, such as the adjacent light beam from the lasers 21a and 21b, are reflected into adjacent light spots that contact each other. When the projections of the two reflectors 31a and 31b in the direction of their respective output light are in contact with each other, as long as the width of the cross-sectional light spot of the lasers' output beams is equal to the projected size of the reflectors in their incident direction,—here, the width is the width of the cross-sectional light spot when projected in the second direction, the second direction being parallel to both the cross-section of the incident light of the reflector and the cross-section of the output light of the reflector,—the adjacent light spots formed by the adjacent light beams after reflection can be in contact each other in the width direction. The cross-sectional light spot of the lasers' output light can also be elliptical, rectangular, regular hexagon, circle, or other shapes. The incident angle of the light incident onto the reflector can be any angle.

Figure 5:
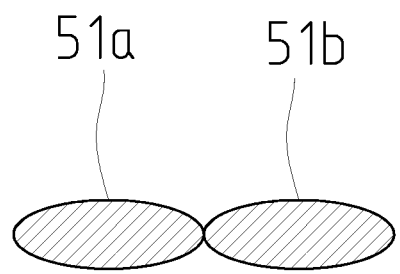
FIG. 5 is a diagram illustrating adjacent light spots on the screen of FIG. 3 viewed in an incident direction toward the screen.

For ease of understanding, take as example where the incident angle of the light onto the reflector is 45 degrees and the cross-section of the output beam of the laser is elliptical. When the direction of major axis of the cross-sectional light spot of the laser output beam is parallel to the output direction of that light beam after reflection by the reflector, i.e., the major axis is the width of the cross-sectional light spot when projected in the second direction, and when the major axis of the cross-sectional light spot is equal to the length of a side of the reflector that reflect that light beam (i.e. the projection of the reflector in the direction of its incident light), shown in FIG. 5 which illustrates adjacent light spots on the screen of FIG. 3 viewed in the incident direction toward the screen, and also with reference to FIG. 4, the light spots 51a, 51b are respectively the light spots of the light beams L1 from the lasers 21a and 21b after being reflected toward the screen 40. The adjacent light spots formed by adjacent light beams L1 after reflection by the reflector are in contact with each other in the direction of the major axis of the light spots (i.e. the above-referenced width direction), so that the spacing between the adjacent light sports in the direction of the major axis is zero. Similarly, the direction of the minor axis of the cross-sectional light spot of the laser output beam can be made to be parallel to the direction of the output light of the reflectors, and the minor axis can be made equal to the length of the side of the reflector that reflect the light beam; hence, the adjacent light spots formed by adjacent light beams L1 after reflection by the reflector are in contact with each other in the direction of the minor axis of the light spots (i.e. the minor axis is in the above-referenced width direction), so that the spacing between the adjacent light sports in the direction of the minor axis is zero.

The above descriptions describe the reduction of light spot spacing of lasers in the same laser group. The reduction of light spot spacing of lasers between different laser groups is described below.

Figure 6:
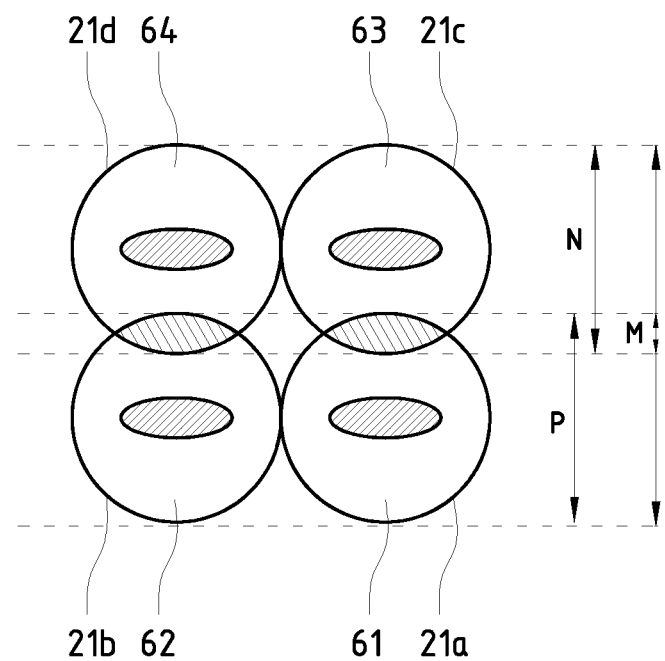
FIG. 6 is a diagram illustrating the first projections and second projections of the laser groups in FIG. 3.

As shown in FIG. 3, the output lights L1 and L2 from the two respective laser groups are parallel to each other, and the reflected light L1 and L2 from the two reflector groups are in the same direction and are parallel to each other. Refer further to FIG. 6, which illustrates the first projections and second projections of the laser groups of FIG. 3. Referring to FIG. 3 and FIG. 6 together, the first projections of laser group 20a (lasers 21a and 21b) on the cross-section of their output light beam are respectively 61 and 62, and the first projections of laser group 20b (lasers 21c and 21d) on the cross-section of their output light beam are respectively 63 and 64. The second projections of the two sets of projections 61, 62 and 63, 64 in the first direction are line segments P and N, respectively, where the first direction is the direction of a line connecting the centers of the lasers of either the first or the second laser group. The overlapping portion of the second projection line segments P and Q is the portion M shown in the figure. Due to the overlapping in portion M, the spacing between light beams from lasers of different laser groups is smaller than that of the conventional technology; therefore the light power density is increased. In such a situation, the factor that limits the spacing between light spots is no longer the sizes of the lasers, but the sizes of the reflectors. Compared to lasers, the reflectors have an advantage that they can be cut into sizes equal to the sizes of the light spot. As long as the height of the reflectors (i.e. the distance from the bottom to the top of the reflector) is equal to the height of the light stop (i.e. the distance from the bottom to the top of the light spot), and as long as the projections of the two reflector groups in the incident direction of the reflectors are in contact with each other, it is possible to make the light beams from one laser group and the light beams from the other laser group, after reflection by the reflectors, come in contact with each other in the second direction, where the second direction is parallel to both the cross-section of the incident light of the reflector and the cross-section of the output light of the reflector. This achieves the result that the light spots of the two laser groups are in contact with each other. In this invention, the top to bottom direction mentioned above is the up-down direction in the drawing.

In this embodiment, because the incident angle of the incident light onto the reflectors is 45 degrees, the output light direction of the reflectors is parallel to the direction of the line connecting the centers of the lasers in the same laser group. In other words, the second projections of the first projections in the direction of the reflectors output partially overlap. Specifically, in this embodiment, each laser group is arranged linearly, and the two laser groups face against each other (i.e. with one to one correspondence); the two groups of first projections of the two opposing laser groups in their respective output direction partially overlap with each other, so that the projections of the first projections in the first direction partially overlap. Specifically, as shown in FIG. 6, the projections of the bottom of one laser group (lasers 21c and 21d) and of the top of the other laser group (lasers 21a and 21b) in their respective light output directions overlap each other.

Figure 7A:
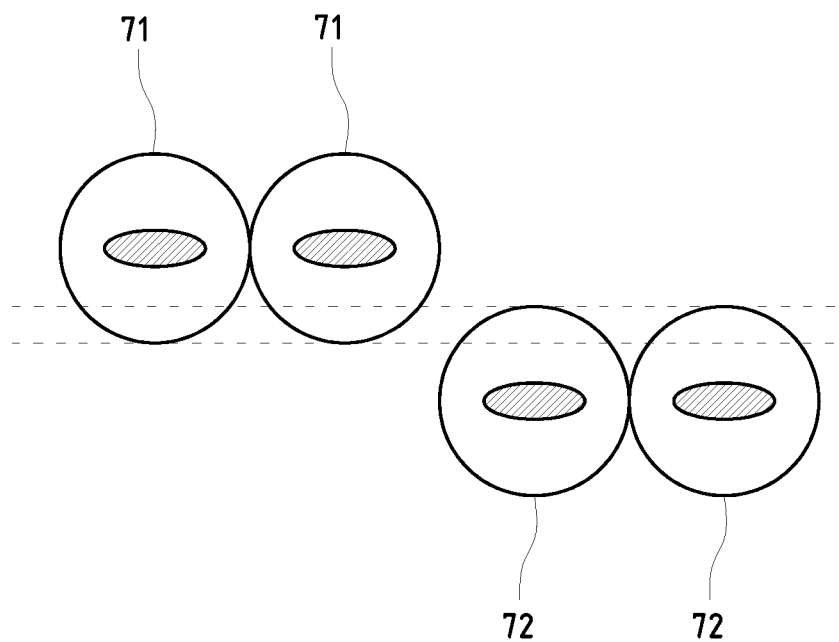
FIGS. 7a and 7b are diagrams illustrating the projections of two laser groups in their respective light output directions in two light source systems according to two other embodiments of the present invention.
Figure 7B:
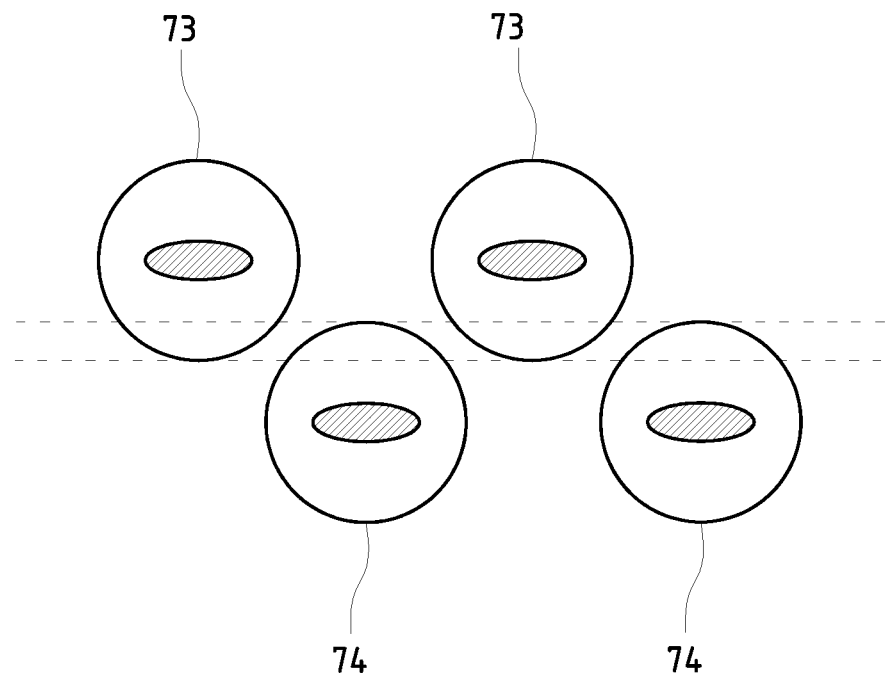

In the embodiment of FIG. 3, the first projections of the two laser groups in their respective output light directions can also be separate from each other, rather than corresponds to each other. Refer to FIG. 7a and FIG. 7b, which illustrate the projections of two laser groups in their respective light output directions in two light source systems according to two other embodiments of the present invention. As shown in FIG. 7a, the first projections 71 and 72 of the two laser groups in their respective light output directions overlap each other when they are projected in the first direction as second projections, but the first projections 71 and 72 are separated from each other. As shown in FIG. 7b, the first projections 73 and 74 of the two laser groups in their respective light output directions overlap each other when they are projected in first direction as second projections, but the first projections 73 and 74 are interleaved.

Figure 8A:
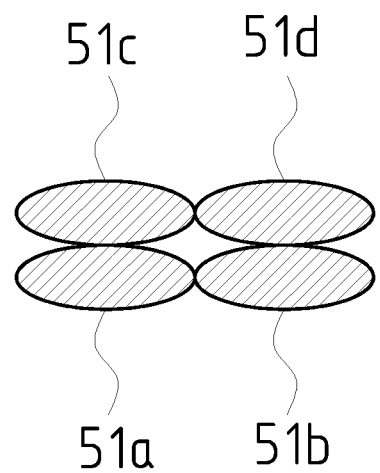
FIGS. 8a, 8b and 8c are light spot patterns on a screen viewed in the incident direction toward the screen for the embodiment of FIG. 3, the conventional technology, and Chinese patent CN 101937163, respectively.
Figure 8B:
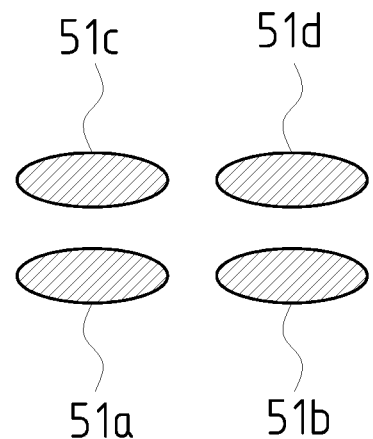
Figure 8C:
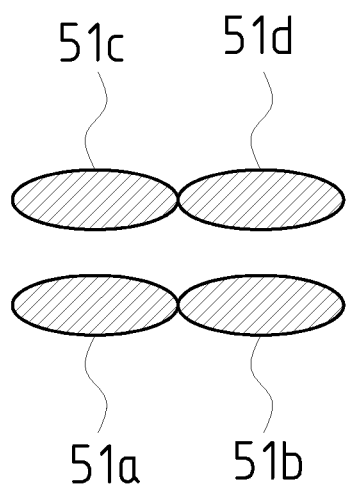

Refer to FIG. 8a, which shows the light spot patterns on the screen 40 of the embodiment of FIG. 3 viewed in the incident direction toward the screen. As shown in FIG. 3 and FIG. 8a, if the major axis of the elliptical light spot of the laser output light is parallel to the light output direction of the reflector, then the reflectors 31a and 31b respectively reflect light from the laser 21a and 21b to form light spots 51a and 51b, and the reflectors 31c and 31d respectively reflect light from the laser 21c and 21d to form light spots 51c and 51d. Because the height of the reflectors is equal to the height of the elliptical light spot (i.e. its minor axis), and because the projections of the two reflector groups in their incident light direction are in contact with each other, light spots 51a, 51b are in contact with light spots 51c, 51d in the second direction, where the second direction is parallel to both the cross-section of the incident light of the reflector and the cross-section of the output light of the reflector, i.e. the up-down direction in the drawing. Thus, densely packed light spots as shown in FIG. 8a are achieved. In comparison, refer to FIGS. 8b and 8c, which are corresponding light spot patterns achieved by the conventional technology and Chinese patent CN 101937163, respectively. The light spot pattern achieved by the conventional technology is shown as 51a-51d in FIG. 8b, and that of CN 101937163 is shown as 51a-51d in FIG. 8c.

For convenience of description, the partial overlap of the first projections of the two laser group, when projected in a first direction as second projections, is referred to as the offset arrangement of the different laser groups. As described above, by using the reflectors, the spacing between light beams from lasers within the same group can be reduced; and by using the offset arrangement of the different laser groups, the spacing between light beams from lasers in different groups can be reduced. Therefore, the spacing between the laser diodes are reduced in two dimensions. Compared to conventional technologies, it significantly reduces the volume of the optical system and increases the light power density of the light source system.

Figure 9:
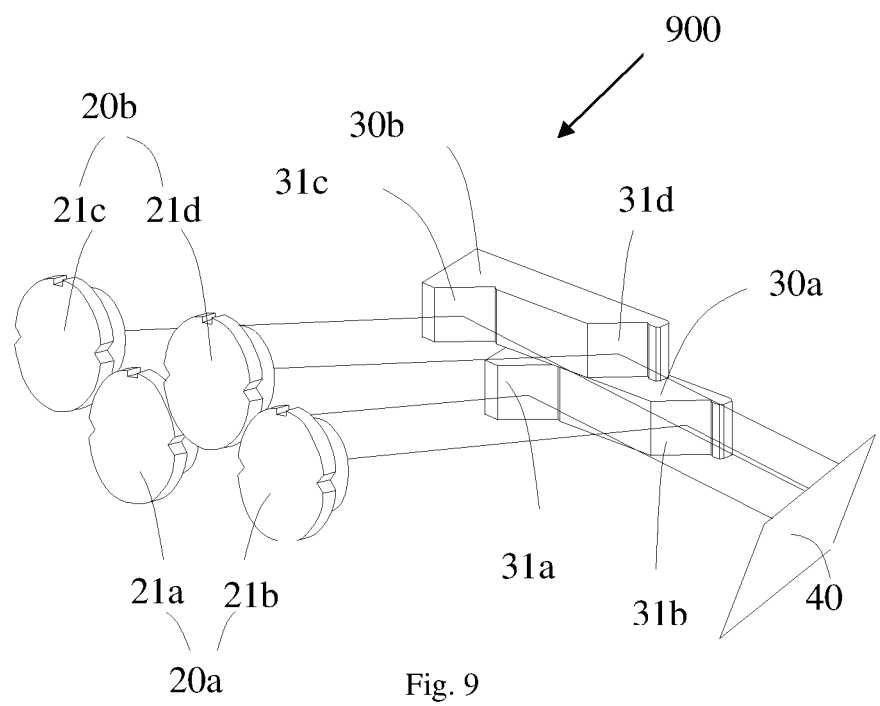
FIG. 9 is a diagram illustrating the structure of a light source system according to another embodiment of the present invention.

Refer to FIG. 9, which illustrates the structure of a light source system according to another embodiment of the present invention. The light source system includes a set of laser sources 900. The laser source 900 includes two laser groups 20a and 20b, which are laser diode groups. The laser diode group 20a includes laser diodes 21a and 21b, and the laser diode group 20b includes laser diodes 21c and 21d. Each laser diode group is arranged in a linear manner, and the two laser diode groups are disposed in the same plane. The light beams from the same laser group are in the same direction and parallel to each other, and the light beams are perpendicular to the plane of the laser diodes.

The two laser diode groups are disposed in the same direction but in an offset manner. The same direction here means that the light beams from the two laser diode groups are in the same direction. The offset manner here means that the first projections of the two laser diode groups in their respective light output directions, when projected in a first direction as second projections, partially overlap each other. The first direction is the direction of a line connecting the centers of at least two lasers of a laser group. As shown in FIG. 9, in this embodiment, the same direction but offset arrangement is as follows: the two lines that the two laser groups are located respectively on are in the same plane perpendicular to the output light direction of the lasers; in the laser diode group 20a, the adjacent laser diodes 21a and 21b are spaced from each other, in the laser diode group 20b, the adjacent laser diodes 21c and 21d are also spaced from each other, and the laser diode groups are disposed on their respective lines in an offset and interleaved manner.

The laser source 900 further includes two reflector groups corresponding to the laser groups; the reflector group 30a includes two reflectors 31a and 31b respectively corresponding to the two laser diodes 21a and 21b, and the reflector group 30b includes two reflectors 31c and 31d respectively corresponding to the two laser diodes 21c and 21d. Each reflector is disposed on the optical axis of its corresponding laser for reflecting the light beams generated by the corresponding lasers. The reflected light beams remain parallel to each other, and the spacing between the reflected light beams is smaller than the spacing between the light beams incident on the reflector groups.

Figure 10:
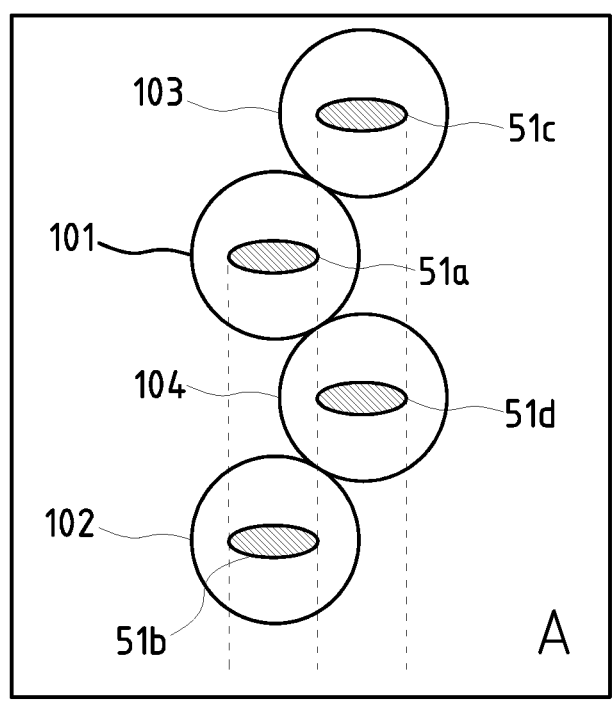
FIG. 10 is a diagram illustrating the first projections of the laser diode groups on the respective cross-sections of their output light beam in the embodiment of FIG. 9.

Refer to FIG. 10, which illustrates the first projections of the laser diode groups on the respective cross-sections of their output light beams in the embodiment of FIG. 9. As shown in FIG. 10, the output light from the laser diode groups form a light beam, and a cross-section of the light beam is in a plane A. The cross-section of the light beam is shown in FIG. 10, where light spots 51a-51d respectively correspond to the light beam emitted by laser diodes 21a-21d, while the circles 101-104 respectively correspond to projections of the outline of the laser diodes 21a-21d in the plane A. Each light spot is an elliptical shape. The minor axis of the output light of the lasers is parallel to the output light direction of the reflectors.

Figure 11:
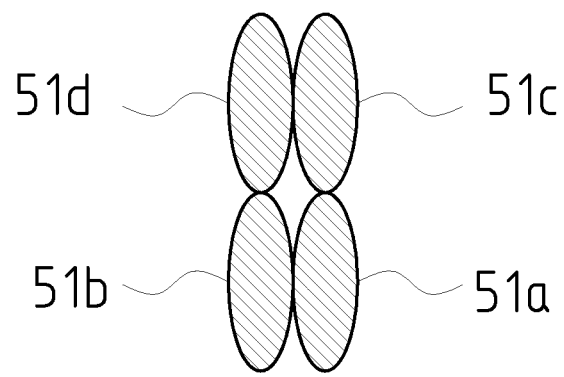
FIG. 11 shows a light spot pattern on the screen of FIG. 9 viewed in the incident direction toward the screen.

Refer to FIG. 11, which shows a light spot pattern on the screen in FIG. 9 viewed in the incident direction toward the screen. Similar to the working principle of the embodiment shown in FIG. 3, as shown in FIG. 11, in this embodiment, the reflectors 31a and 31b respectively reflect light from the lasers 21a and 21b to obtain light spots 51a and 51b which are in contact with each other in the direction of the minor axis; the reflectors 31c and 31d respectively reflect light from the lasers 21c and 21d to obtain light spots 51c and 51d which are in contact with each other in the direction of the minor axis. In practice, to lessen the difficulty in assembling, the projections of the reflectors in their incident light direction are often made slightly larger than the width of the light beams, and the projections of the adjacent reflectors in the output light direction also have certain spacing between them. In such situations, the light spots 51a and 51b, and 51c and 51d are no longer in contact but have a slight space in between; nevertheless, the spacing is still smaller than that between the light beam directly from the laser diodes 92 and 94.

Figure 12:
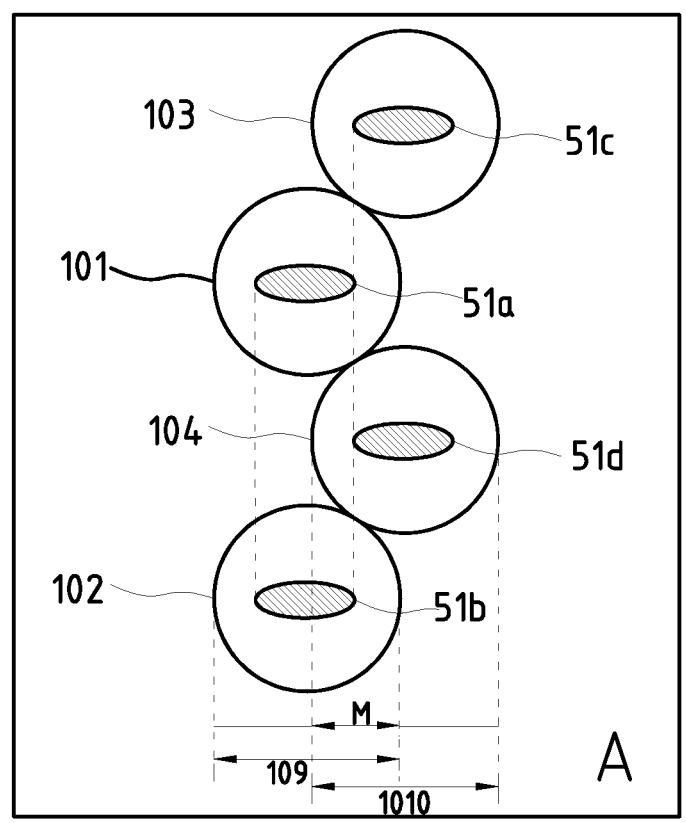
FIG. 12 is a diagram illustrating the first projections and second projections of the laser groups of the embodiment in FIG. 9.

The reduction of the spacing between light beams of different laser groups is explained below. Refer to FIG. 12, which illustrates the first projections and second projections of the laser groups of the embodiment in FIG. 9. As shown in FIG. 12, in this embodiment, the first projections of the laser diode group 20a in the plane A are 101 and 102, and the second projections of the first projections 101 and 102 in the first direction is 109, where the first direction is along the line connecting the centers of two lasers of any of the laser groups; the first projections of the laser diode group 20b in the plane A are 103 and 104, and the second projection of the first projections 103 and 104 in the first direction is 1010. The second projection 109 and the second projection 1010 overlap in the region M.

The reflectors do not change the relative positions of the laser diodes 20a and 20b in the vertical direction, the vertical direction being the direction perpendicular to the plane formed by the incident and output lights of the reflector, therefore, the relative positions of the projection of the two laser diode groups in the plane A, after they are further projected in the output light direction of the reflectors, determines the relative position of the laser diodes 20a and 20b in the vertical direction. Therefore, the fact that projections 109 and 1010 overlap with each other means that the vertical spacing between the light spots of these two laser diode groups are smaller than that spacing if the laser diodes 20a and 20b were arranged in orthogonal columns and rows.

Figure 13:
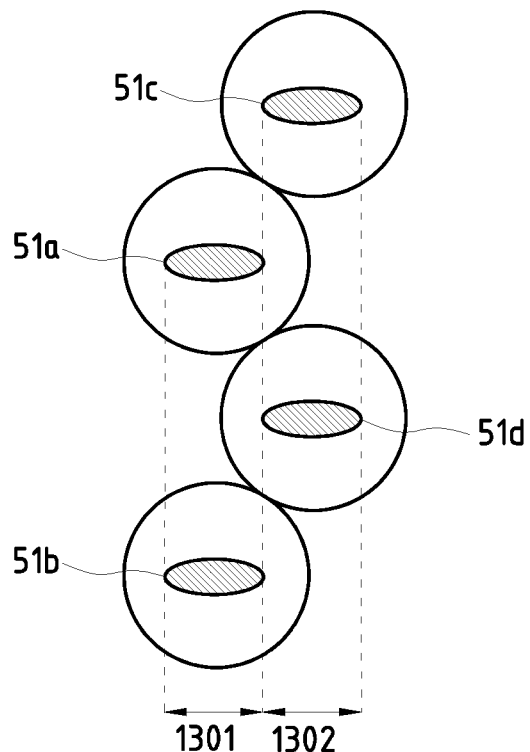
FIG. 13 is a diagram illustrating the first projections of laser groups in a light source system according to another embodiment of the present invention.

The most preferred arrangement of laser diodes in this embodiment is shown in FIG. 13, which illustrates the first projections of two laser groups in a light source system according to another embodiment of the present invention. The output light spots of a laser diode group are 51a, 51b and their second projection in the first direction is 1301; the output light spots of another laser diode group are 51c, 51d and their second projection in the first direction is 1302. The second projections 1301 and 1302 are in contact with each other. In this situation, to completely reflect the light emitted by the laser diodes, the two reflector groups must be in contact with each other, and the reflected light spots of the two laser diode groups on the screen are also in contact with each other in the vertical direction. As shown in FIG. 11, light spots 51a, 51b are respectively in contact with light spots 51c, 51d in the direction of their major axes.

Figure 14:
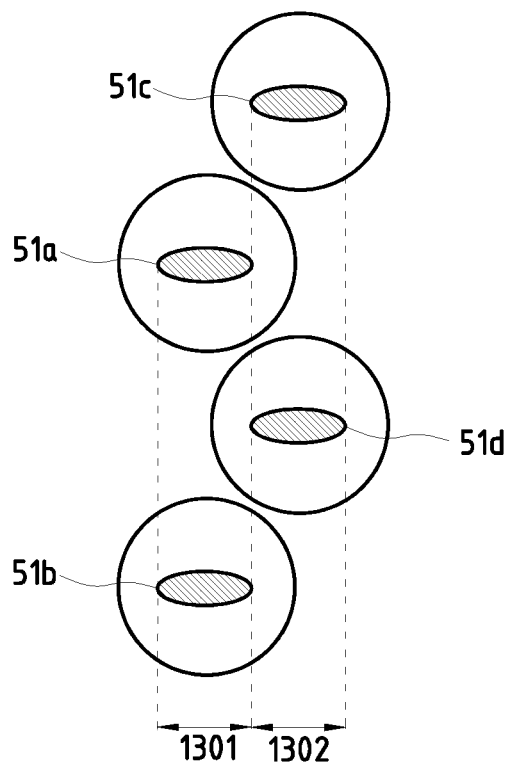
FIG. 14 is a diagram illustrating the first projections of laser groups in a light source system according to another embodiment of the present invention.

The arrangement where the two laser diode groups are disposed in the same direction but in an offset manner can also be achieved by placing the two lines of the two laser diode groups in different sectional planes in the output light direction of the lasers. The adjacent lasers in one laser group are spaced apart, the adjacent lasers in the other laser group are also spaced apart, and the projections of the two laser groups in their respective output light directions are offset in the direction of the two lines and are interleaved. It should be noted that, being "interleaved" does not require the projections of the adjacent lasers in their respective output light direction to be tangential and in contact with each other; the projections can be separated from each other (such as that shown in FIG. 14). In short, the arrangement where the two laser diode groups are disposed in the same direction but in an offset manner can reduce the spacing between the light beams in different laser diode groups. By adjusting the offset, it is possible to make the light beams from one laser group and the light beams from the other laser group, after reflection by the reflectors, in contact with each other in the second direction, where the second direction is parallel to both the cross-section of the incident light of the reflector and the cross-section of the output light of the reflector.

As described above, by using the reflectors, the spacing between light beams from laser diodes in the same group can be reduced; and by using the offset arrangement of the laser diode groups, the spacing between light beams from laser diodes in different groups can be reduced. Therefore, the spacing between the laser diodes is reduced in two dimensions. Compared to conventional technologies, it significantly reduces the volume of the optical system and increases the light power density of the light source system.

In the above embodiments, laser groups of 1×2 arrays are used as examples. In other embodiments, the lasers in the laser groups can have other numbers and arrangements, and the lasers do not have to be arranged in a regular array of columns and rows. The invention is not limited to the specific arrangements. It should be pointed out that, as long as the number of lasers in at least one laser group is two or more, the spacing of light beams between different laser groups can be reduced in the manners described above.

Figure 15:
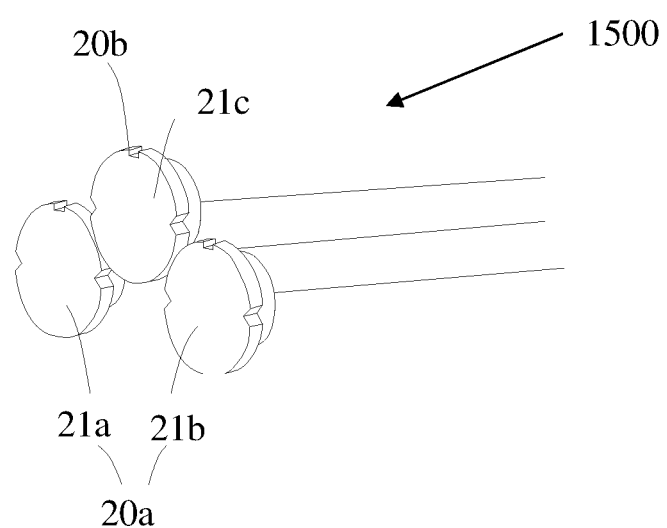
FIG. 15 is a diagram illustrating the structure of a light source system according to an embodiment of the present invention.
Figure 16:
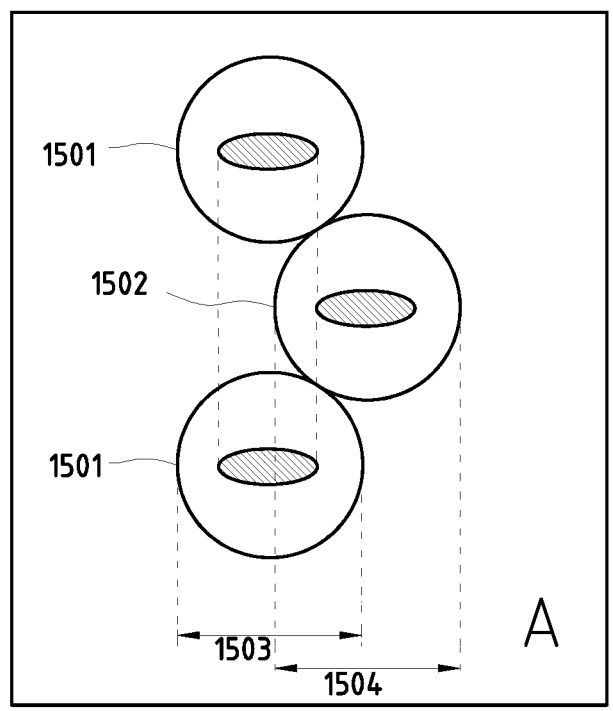
FIG. 16 is a diagram illustrating the first projections and second projections of the laser groups of the embodiment in FIG. 15.

Refer to FIGS. 15 and 16, where FIG. 15 illustrates the structure of a light source system according to an embodiment of the present invention, and FIG. 16 illustrates the first projections and second projections of the laser groups of the embodiment in FIG. 15. As shown in FIG. 15, the laser source 1500 includes two laser groups 20a and 20b. The laser group 20a includes two lasers 21a and 21b, and the laser group 20b includes one laser 21c. The light beams from the two laser groups are in the same direction and parallel to each other. As shown in FIGS. 15 and 16, the first projections of the laser groups 20a and 20b in the cross-sections of their respective output light beams are 1501 and 1502, and the second projections of the first projections 1501, 1502 in the first direction are 1503 and 1504. The second projections 1503 and 1504 partially overlap with each other. The first direction is the direction along the line connecting the centers of the two lasers in the laser group 20a. Because the second projections 1503 and 1504 partially overlap with each other, the spacing between light spots of light beams in different laser groups is reduced as compared to the conventional technology. This increases the light power density of the laser light source and reduces its volume.

As in the embodiment of FIG. 9, in this embodiment, preferably, each laser group has a linear arrangement, and the two lines of the two laser groups are located in the same sectional plane in the output light direction of the lasers, to make it easy to install a heat dissipating device for the lasers. Also, the adjacent lasers in the same laser group can be spaced apart, and the two laser groups are offset in the direction of their respective lines and are interleaved. It should be understood that other technical features of the embodiment of FIG. 9 can also be applied to this embodiment.

Figure 17:
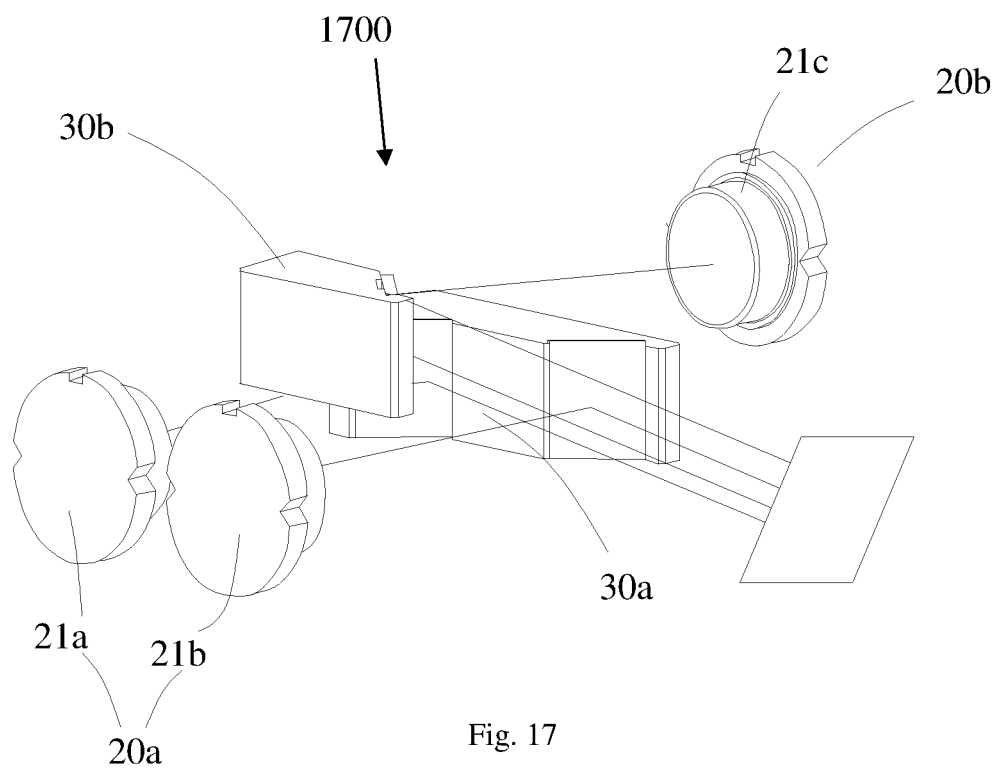
FIG. 17 is a diagram illustrating the structure of a light source system according to another embodiment of the present invention.
Figure 18:
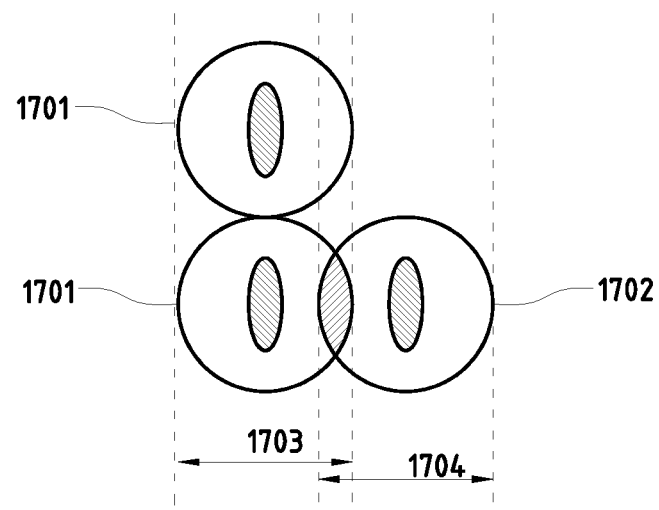
FIG. 18 is a diagram illustrating the first projections and second projections of the laser groups of the embodiment in FIG. 17.

Refer to FIGS. 17 and 18, where FIG. 17 illustrates the structure of a light source system according to another embodiment of the present invention, and FIG. 18 illustrates the first projections and second projections of the laser groups of the embodiment in FIG. 17. As shown in FIG. 17, the laser source 1700 includes two laser groups 20a and 20b. The laser group 20a includes two lasers 21a and 21b, and the laser group 20b includes one laser 21c. The light beams from the same laser group are in the same direction and parallel to each other. The light beams from the two laser groups are in the opposite direction and parallel to each other.

The laser source 1700 further includes two reflector groups 30a and 30b for respectively reflecting the light beams from the two laser groups 20a and 20b. After reflection, the light beams from the two laser groups are in the same direction and parallel to each other.

As shown in FIGS. 17 and 18, the first projection of the laser groups 20a and 20b in the cross-sections of their respective output light beams are 1701 and 1702, and the second projections of the first projections 1701 and 1702 in the first direction are 1703 and 1704. The second projections 1703 and 1704 partially overlap with each other. The first direction is the direction along the line connecting the centers of the two lasers in the laser group 20*a*. Because the second projections 1703 and 17504 partially overlap with each other, the spacing between light spots of light beams in different laser groups is reduced compared to the conventional technology. This increases the light power density of the laser light source and reduces its volume.

Similar to the embodiment of FIG. 3, in this embodiment, preferably, each laser group has a linear arrangement, and the two laser groups face against each other (i.e. with one to one correspondence); the two first projections of the two opposing laser groups in their respective output direction partially overlap with each other. This reduces the volume of the light source and increases light power density. In addition, the adjacent lasers in the same laser group can contact each other, further reducing volume and increasing light power density. It should be understood that other technical features of the embodiment of FIG. 3 can be applied to this embodiment as well.

This embodiment uses a simple example of 3 lasers to illustrate the invention. It should be understood that as long as one laser group has at least two lasers, the spacing of light beams between different laser groups can be reduced in the above manners, so the number of lasers in the other laser group is not limited.

Figure 19:
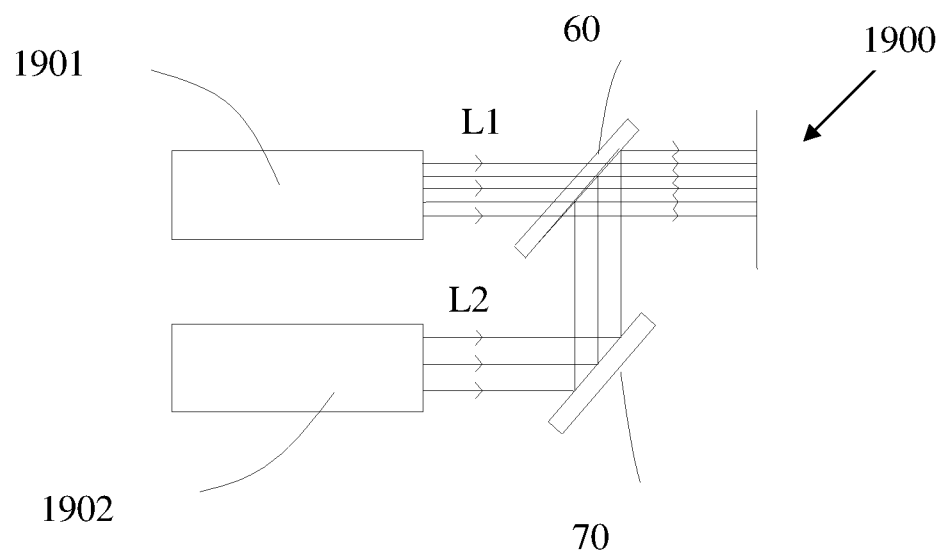
FIG. 19 is a diagram illustrating the structure of a light source system according to another embodiment of the present invention.
Figure 20:
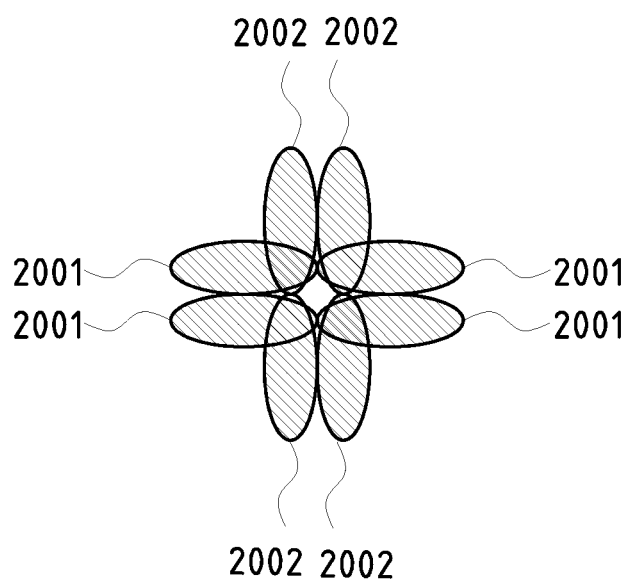
FIG. 20 is a light spot pattern on the screen of FIG. 19 viewed in the incident direction toward the screen.

Refer to FIGS. 19 and 20, where FIG. 19 illustrates the structure of a light source system according to another embodiment of the present invention, and FIG. 20 is a light spot pattern on the screen of FIG. 19 viewed in the incident direction toward the screen. In this embodiment, the light source system 1900 includes two of the above-described laser sources 1901 and 1902, and further includes a light combining device 60 and a reflector 70. The light beam L1 from the laser source 1901 is incident on the first side of the light combining device 60, and the light beam L2 from the laser source 1902 is reflected by the reflector 70 and then incident on the second side of the light combining device 60. The light combining device respectively transmits and reflects the light beams L1 and L2 that are incident on its two sides, so that the light spots of the light beams, after the transmission and reflection, at least partially overlap with each other.

Specifically, in this embodiment, the light combining device 60 reflects the light that is reflected onto its surface by the reflector 70, and transmits the other light. It should be understood that the light combining device is not limited by which light it transmits and which light it reflects. Further, preferably, the position of the reflector is adjustable, so that the incident angle of the light onto the reflector is adjustable. This makes it easy to exchange laser sources. The reflector 70 can significantly reduce the size of the laser source, so that the two laser groups can be arranged in parallel, rather than perpendicularly. This type of design which uses reflectors to reduce light source sizes is advantageous when many semiconductor lasers are employed; in particular, when heat dissipating devices are arranged in parallel, it is easier to design the cooling air path than when the heat dissipating devices are arranged perpendicularly. In fact, the light beam L2 from the laser source 1902 can be directly incident on the second side of the light combining device 60; thus, the reflector 70 may be omitted.

The polarization directions of the two laser sources may be perpendicular to each other. In such a situation, the light combining device may be a polarization-based light combining device, which respectively transmits and reflects light beams from the two laser sources. For example, the laser source 1902 may be turned 90 degrees with respect to the laser source 1901, so that its light is now reflected by the polarization-based light combining device, rather than transmitting through the device. This causes the light spots of the two laser beams to overlap with each other, so that light having different positions and directions can be combined into the same direction. Of course, when the light combining device is a polarization-based light combining device, the polarization directions of the light beams from the two laser sources can be identical, and a ½ wave plate can be used to change the polarization direction of one of the light beams so that it is now perpendicular to the polarization of the other beam, before it is incident on the polarization-based light combining device.

The wavelengths of the two laser sources may be different from each other. In such a situation, the light combining device may be a wavelength selection device, which transmits the light form one laser source and reflects the light from the other laser source.

Preferably, the light spots of the transmitted and reflected light beams overlap in their center regions, so as to increase the overlapping portions of the light spots and increase the light power density. For example, when the polarization direction of the two light beams from the two laser sources are perpendicular to each other, as shown in FIG. 20, the light spot of one laser source is 2001 and the light spot of another laser source is 2002, which overlap with each other in the center region.

Compared to conventional technologies, by using the polarization-based light combining device to combine the light beams from the laser sources, the light power density is 9 times that achieved by conventional technologies.

It should be noted that the various embodiments of the present invention, or their technical features, can be combined in any suitable manner to achieve other embodiments with new technical effects.

While embodiments of the present invention are described above, the invention is not limited to the embodiments. Any equivalent structures or equivalent methods based on this disclosure and drawings, or any direct or indirect applications in other relevant technical fields, are within the protection scope of this patent.

What is claimed is:

1. A light source system, including two laser groups and a light combining device,
   wherein the light beams from the two laser groups are respectively incident on the two sides of the light combining device, the light combining device respectively transmits and reflects the light beams that are incident on its two sides, the light spots of the light beams, after the transmission and reflection, at least partially overlap with each other;
   the laser light source comprising:
   two laser groups, at least one of the laser groups including at least two lasers, wherein light beams generated by each laser group are in the same direction and parallel to each other;
   two reflector groups corresponding to the two laser groups, at least one of the reflector groups including at least two reflectors, each reflector being disposed on an optical axis of the corresponding laser; each reflector group reflecting the light beams generated by the corresponding laser group, wherein a spacing between light beams output from the reflector group is smaller than a spacing between the light beams inputted to the reflector group;

wherein the light beams generated by the two laser groups are parallel to each other, and the light beams output from the two reflector groups are in the same direction and parallel to each other;

wherein first projections of the light beams generated by the two laser groups on their respective cross-sections partially overlap with each other when projected in a first direction as second projections, the first direction being along a line connecting centers of the at least two lasers in the at least one laser group, wherein the light spots of the transmitted and reflected light beams overlap in their center regions.

2. The light source system of claim 1, wherein the light source system further includes a reflector, a light beam from one of the laser groups is reflected by the reflector and then incident on one side of the light combining device.

3. The light source system of claim 2, wherein a position of the reflector is adjustable, such that the incident angle of the incident light onto the reflector is adjustable.

4. The light source system of claim 1, wherein the light combining device is a polarization-based light combining device or a wavelength selection device.

5. The light source system of claim 1, wherein the at least one reflector group that includes at least two reflectors includes a body and the at least two reflectors disposed on the same side of the body.

6. The light source system of claim 5, wherein two adjacent reflects in the at least one reflector group that includes at least two reflectors are disposed in a step arrangement.

7. The light source system of claim 6, wherein projections of the two adjacent reflectors in their respective light output directions are in contact with each other.

8. The light source system of claim 7, wherein a width of a cross-sectional light spot of the output light beams of the lasers is equal to a projected size of the reflectors in their light incident direction, wherein adjacent light spots, formed by adjacent light beams from the same laser group and after reflection by the reflector, are in contact with each other in a width direction, wherein the width is a width of the light spot when projected in the second direction, the second direction being parallel to both a cross-section of the incident light onto the reflectors and a cross-section of the output light from the reflector.

9. The light source system of claim 1, wherein light spots formed by adjacent light beams from the lasers of different laser groups and after reflection by the reflector are in contact with each other in a second direction, the second direction being parallel to both a cross-section of an incident light of the reflector and a cross-section of an output light of the reflector.

10. The light source system of claim 1, each laser group is arranged linearly, and the two laser groups are disposed in a same direction and in an offset manner, wherein two lines that the two laser groups are located respectively on are in a same sectional plane in an output light direction of the lasers, adjacent lasers in one of the two laser groups are spaced from each other, adjacent lasers in another one of the two laser groups are spaced from each other, and the two laser groups are disposed on their respective lines in an offset and interleaved manner; or wherein two lines that the two laser groups are located respectively on are in different sectional planes in an output light direction of the lasers, adjacent lasers in one of the two laser groups are spaced from each other, adjacent lasers in another one of the two laser groups are spaced from each other, and projections of the two laser groups in their respective output direction are located on their respective lines in an offset and interleaved manner.

11. The light source system of claim 1, wherein each laser group is arranged linearly, wherein the two laser groups face against each other, and wherein projections of the two laser groups in their respective output direction partially overlap with each other.

12. The light source system of claim 10, wherein the interleaved manner includes the projections of the adjacent lasers in their respective output light direction are tangential or separated.

13. A light source system, comprising a first laser light source, a second laser light source, and a light combining device, wherein light beams from the first and second laser light sources are respectively incident on the two sides of the light combining device, the light combining device respectively transmits and reflects the light beams that are incident on its two sides, wherein a first light patent formed by the light beam from the first laser light source, after being transmitted through the light combining device, includes a plurality of light spots that are adjacent to each other and are elongated in a first direction, wherein a second light patent formed by the light beam from the second laser light source, after being reflected by the light combining device, includes a plurality of light spots that are adjacent to each other and are elongated in a second direction which is non-parallel to the first direction, and wherein the first light patent and the second light pattern partially overlap in their center areas.

14. The light source system of claim 13, wherein the light combining device is a polarization-based light combining device or a wavelength selection device.

* * * * *